(12) United States Patent
Lin et al.

(10) Patent No.: US 11,682,816 B2
(45) Date of Patent: Jun. 20, 2023

(54) FILTER CIRCUITS

(71) Applicant: MEDIATEK INC., Hsin-Chu (TW)

(72) Inventors: Yi-Chieh Lin, Hsinchu (TW);
Shih-Chia Chiu, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 330 days.

(21) Appl. No.: 16/940,379

(22) Filed: Jul. 27, 2020

(65) Prior Publication Data

US 2021/0057143 A1 Feb. 25, 2021

Related U.S. Application Data

(60) Provisional application No. 62/982,115, filed on Feb. 27, 2020, provisional application No. 62/890,105, filed on Aug. 22, 2019.

(51) Int. Cl.
| | |
|---|---|
| *H01P 1/203* | (2006.01) |
| *H01P 7/08* | (2006.01) |
| *H01F 27/28* | (2006.01) |
| *H01F 27/29* | (2006.01) |

(Continued)

(52) U.S. Cl.
CPC ..... *H01P 1/20345* (2013.01); *H01F 27/2804* (2013.01); *H01F 27/29* (2013.01); *H01P 1/20327* (2013.01); *H01P 1/20381* (2013.01); *H01P 7/08* (2013.01); *H03H 7/0138* (2013.01); *H05K 1/165* (2013.01)

(58) Field of Classification Search
CPC ............ H01P 1/20345; H01P 1/20381; H01P 1/20327; H01P 7/08
USPC ...................................................... 333/204
See application file for complete search history.

(56) References Cited

U.S. PATENT DOCUMENTS

| | | | |
|---|---|---|---|
| 6,191,669 B1 * | 2/2001 | Shigemura | H01P 1/20345 333/204 |
| 6,614,329 B1 | 9/2003 | Woods | |
| 2006/0139125 A1 | 6/2006 | Shiga-ken | |

(Continued)

FOREIGN PATENT DOCUMENTS

| | | |
|---|---|---|
| CN | 203983430 U | 12/2014 |
| JP | 2000-91806 A | 3/2000 |

(Continued)

OTHER PUBLICATIONS

Hans H. Cuno, Bandpassfilter und Bandsperre, Vorbereitung auf die Amateurfunk Lizenz Prüfung, Jan. 1, 1993, ISBN: 978-3-7724-5402-8, Frech-Verlag, p. 128, the first section, Stuttgart, Germany, XP055906154, Jan. 1, 1993.

*Primary Examiner* — Rakesh B Patel
(74) *Attorney, Agent, or Firm* — Winston Hsu (57) ABSTRACT

A filter circuit includes an input node, an output node, a first filtering element and a second filtering element. The first filtering element has a first terminal coupled to the input node and a second terminal, and is configured to provide a first signal conducting path toward the second terminal for conducting a first signal received at the input node to the second terminal. The second filtering element has a first terminal coupled to the input node and a second terminal, and is configured to provide a second signal conducting path toward the output node for conducting a second signal received at the input node to the output node. The second terminal of the first filtering element and the second terminal of the second filtering element are open-circuit terminals.

16 Claims, 7 Drawing Sheets

(51) Int. Cl.
*H03H 7/01* (2006.01)
*H05K 1/16* (2006.01)

(56) References Cited

U.S. PATENT DOCUMENTS

| 2011/0050355 A1 | 3/2011 | Huang |
| 2012/0007689 A1 | 1/2012 | Zhang |
| 2016/0181678 A1* | 6/2016 | Robert ................. H01P 1/2039 333/204 |

FOREIGN PATENT DOCUMENTS

| JP | 2000-101303 A | 4/2000 |
| KR | 10-2006-0009827 | 2/2006 |
| KR | 10-0814294 B1 | 3/2008 |
| TW | 201236366 A1 | 9/2012 |

* cited by examiner

FILTER CIRCUITS

CROSS REFERENCE TO RELATED APPLICATIONS

This application claims the benefit of U.S. Provisional Application No. 62/890,105 filed 2019 Aug. 22 and U.S. Provisional Application No. 62/982,115 filed 2020 Feb. 27, the entirety of which is incorporated by reference herein.

BACKGROUND

The rise of 5G wireless communications and 77 GHz automotive radar technologies begin an exciting new era in the world of millimeter-wave application. Filter is one of the key passive components for on chip or on package substrate, especially in millimeter-wave application. Filter designs are not only simply treated for band pass or rejection, but also used for impedance matching and co-design with other active devices. When designing a filter, several design tradeoffs need to be considered to satisfy different design specification, such as miniaturized physical size and reduced insertion loss.

Therefore, a miniaturized filter design with the properties of good filtering performance and easy to be implemented on the package substrate is highly required.

SUMMARY

According to an embodiment of the invention, a filter circuit comprises an input node, an output node, a first filtering element and a second filtering element. The first filtering element has a first terminal coupled to the input node and a second terminal, and is configured to provide a first signal conducting path toward the second terminal for conducting a first signal received at the input node to the second terminal. The second filtering element has a first terminal coupled to the input node and a second terminal, and is configured to provide a second signal conducting path toward the output node for conducting a second signal received at the input node to the output node. The second terminal of the first filtering element and the second terminal of the second filtering element are open-circuit terminals.

According to another embodiment of the invention, a filter circuit comprises an input node, an output node, a first trace, a second trace and a third trace. The first trace is routed on a substrate and has a first terminal coupled to the input node and a second terminal. The second trace is routed on the substrate and has a first terminal coupled to the input node and a second terminal coupled to the output node. The third trace is routed on the substrate and has a first terminal coupled to the output node and a second terminal. The first trace operates as a first filtering element for filtering out a first signal received at the input node. The second trace and the third trace operate as a second filtering element for passing a second signal received at the input node to the output node.

According to yet another embodiment of the invention, a filter circuit comprises an input node, an output node, a first filtering element and a second filtering element. The first filtering element has a first terminal coupled to the input node and a second terminal, and is configured to filter out a signal with a first frequency signal for not going through to the output node. The second filtering element has a first terminal coupled to the input node and a second terminal, and is configured to allow a signal with a second frequency to go through the output node. The second terminal of the first filtering element and the second terminal of the second filtering element are open-circuit terminals.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
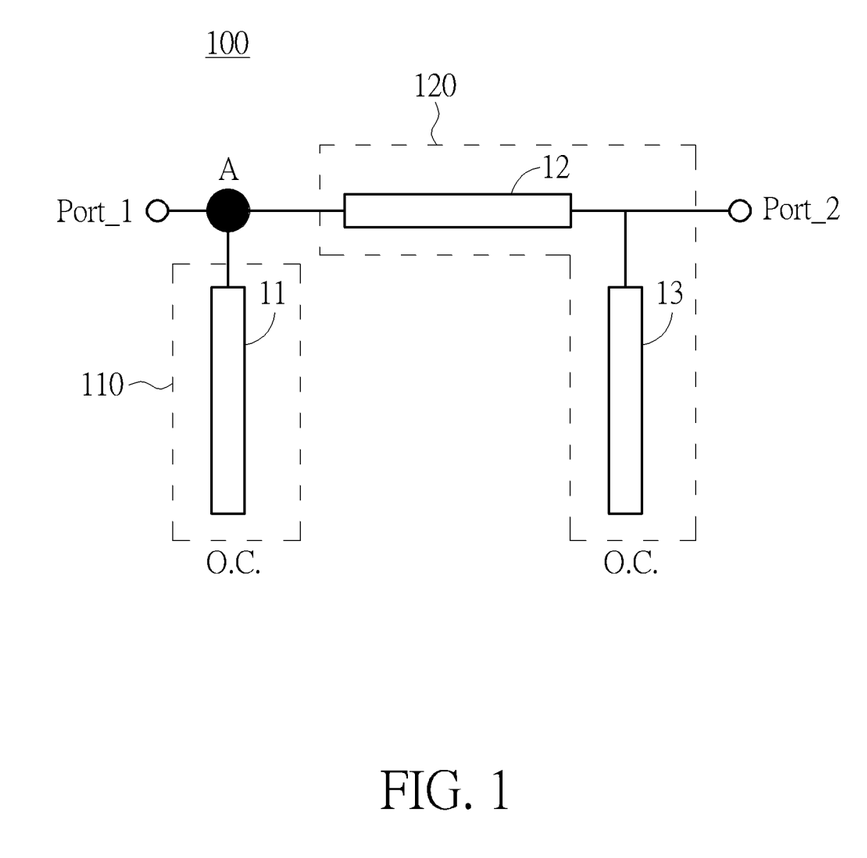
FIG. 1 is a schematic diagram of a filter circuit according to an embodiment of the invention.

FIG. 1 is a schematic diagram of a filter circuit according to an embodiment of the invention. The filter circuit 100 may comprise two ports, such as the ports Port_1 and Port_2 shown in FIG. 1. The filter circuit 100 may be configured to provide a bi-directional filtering function, therefore, one of the two ports may be an input node of the filter circuit 100, and the other of the two ports may be an output node of the filter circuit 100.

The filter circuit 100 may comprise a first filtering element 110 and a second filtering element 120. The first filtering element 110 may have a first terminal coupled to one of the two ports Port_1 and Port_2 (for example, the input node of the filter circuit 100) and a second terminal. The second filtering element 120 may have a first terminal coupled to the one of the two ports Port_1 and Port_2 (for example, the input node of the filter circuit 100) and a second terminal.

According to an embodiment of the invention, the second terminal of the first filtering element 110 and the second terminal of the second filtering element 120 are open-circuit (labeled as O.C. in FIG. 1) terminals. The first filtering element 110 is configured to provide a first signal conducting path toward the second terminal of the first filtering element 110, for conducting a first signal to the second terminal of the first filtering element 110. The second filtering element 120 is configured to provide a second signal conducting path toward the output node of the filter circuit 100, for conducting a second signal to the output node of the filter circuit 100.

According to an embodiment of the invention, the first signal and the second signal may be signal components comprised in the signals received at the input node the filter circuit 100 with different resonance frequencies. The first signal may be the unwanted signal having a resonance frequency in an unwanted frequency band, and the second signal may be the wanted signal having a resonance frequency in a wanted frequency band.

Therefore, in the embodiments of the invention, the unwanted signal will not go through to the output node the filter circuit 100 (for example, the Port_2). The total network of the filter circuit 100 operates as a notch filter for the unwanted signal in the unwanted frequency band. On the other hand, the wanted signal will pass to the output node the filter circuit 100 (for example, the Port_2). The total network of the filter circuit 100 operates as a band pass filter for the wanted signal in the wanted frequency band.

According to an embodiment of the invention, the first filtering element 110 may comprise a resonator 11, and the second filtering element 120 may comprise two resonators 12 and 13. The resonators 12 and 13 are coupled in serial between the input node of the filter circuit 100 and the second terminal of the second filtering element 120, and a connection node of the resonators 12 and 13 is coupled to the output node of the filter circuit 100.

According to an embodiment of the invention, the resonators 11, 12 and 13 may be implemented by a plurality of traces routed on a substrate. Therefore, in some embodiments of the invention, the filter circuit may comprise at least a first trace routed on the substrate and having a first terminal coupled to the input node, a second trace routed on the substrate and having a first terminal coupled to the input node and a second terminal coupled to the output node, and a third trace routed on the substrate and having a first terminal coupled to the output node. The second terminal of the first trace and the second terminal of the third trace are open-circuit terminals. The first trace may operate as a filtering element or a notch filter for filtering out unwanted signal, and the second trace and the third trace may operate as another filtering element or a band pass filter for passing the wanted signal received at the input node to the output node of the filter circuit.

According to an embodiment of the invention, one or more traces of the filter circuit may be routed spirally on the substrate.

Figure 2:
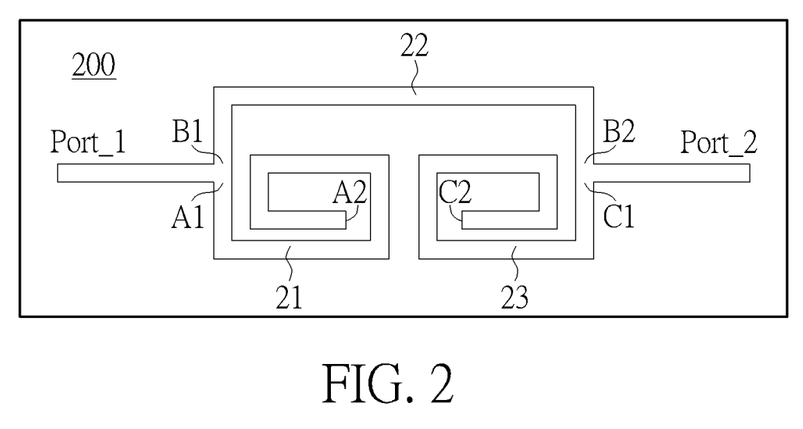
FIG. 2 shows an exemplary layout of the filter circuit according to an embodiment of the invention.

FIG. 2 shows an exemplary layout of the filter circuit according to an embodiment of the invention. In this exemplary layout, the traces 21 and 23 are routed spirally as rectangular spirals on substrate 200.

Figure 3:
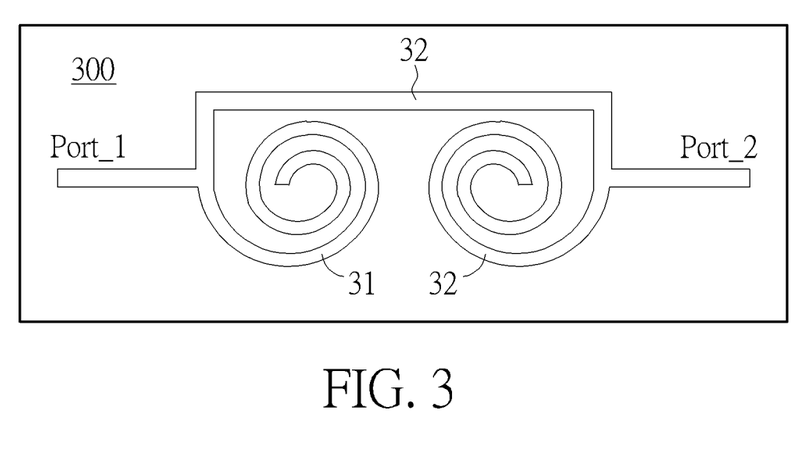
FIG. 3 shows an exemplary layout of the filter circuit according to another embodiment of the invention.

FIG. 3 shows an exemplary layout of the filter circuit according to another embodiment of the invention. In this exemplary layout, the traces 31 and 33 are routed spirally as circular spirals on substrate 300.

In should be noted that although rectangular spirals and circular spirals are shown as the exemplary layouts of the filter circuit, the invention should not be limited thereto. The spiral routing and the shapes of spiral routing shown in FIG. 2 and FIG. 3 are merely some of a variety of possible routings for routing the traces on the substrate, and the invention should not be limited to any specific type of routings.

According to an embodiment of the invention, one or more traces of the filter circuit may be routed flat and straight toward at least a predetermined direction on the substrate.

Figure 4:
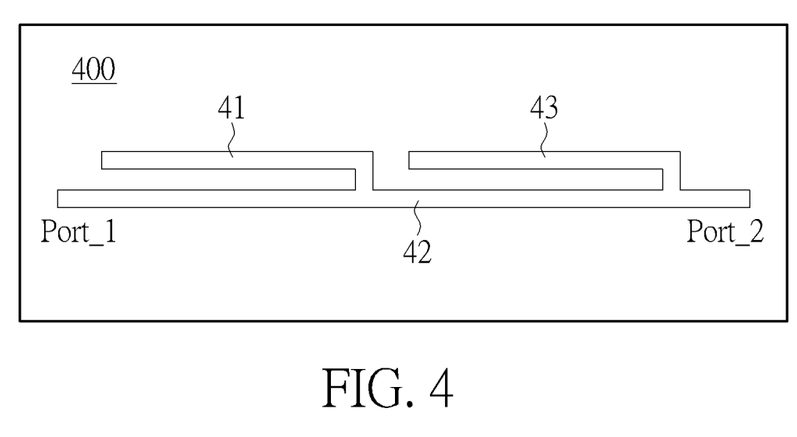
FIG. 4 shows an exemplary layout of the filter circuit according to yet another embodiment of the invention.

FIG. 4 shows an exemplary layout of the filter circuit according to yet another embodiment of the invention. In this exemplary layout, the traces 41, 42 and 43 are routed horizontally on substrate 400. The traces 41 and 43 are routed flat and straight toward the same direction (e.g. extend toward the left hand side after extending upward from the trace 42), and the trace 42 is routed flat and straight toward two opposite directions (e.g. extends toward both the left hand side and the right hand side).

Figure 5:
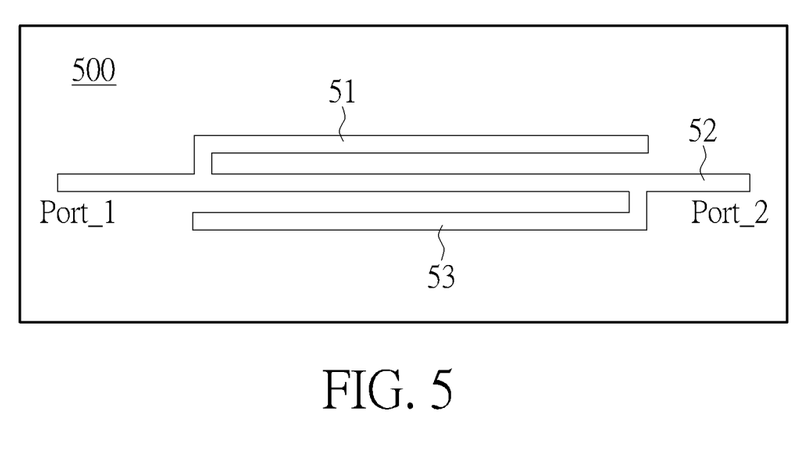
FIG. 5 shows an exemplary layout of the filter circuit according to yet another embodiment of the invention.

FIG. 5 shows an exemplary layout of the filter circuit according to yet another embodiment of the invention. In this exemplary layout, the traces 51, 52 and 53 are routed horizontally on substrate 500. The traces 51 and 53 are routed flat and straight toward two opposite directions (e.g. the trace 51 may extend toward the right hand side after extending upward from the trace 52, and the trace 53 may extend toward the left hand side after extending downward from the trace 52), and the trace 52 is routed flat and straight toward the opposite directions (e.g. extends toward both the left hand side and the right hand side).

It should be noted that, in the slender routings embodiments as shown in FIG. 4 and FIG. 5, the traces may be substantially arranged in parallel on the substrate. In this manner, the layout of the filter circuit may have a slender shape, which is helpful for being packaged in a thin, flat and/or narrow shape package.

In should be further noted that the flat routings and the shapes of flat routing shown in FIG. 4 and FIG. 5 are merely some of a variety of possible routings for routing the traces on the substrate, and the invention should not be limited to any specific type of routings.

According to an embodiment of the invention, the overall frequency response of the corresponding filter circuit, including locations of the rejected frequency band and the pass band, may vary as the length of the traces changes. Therefore, a desired filtering performance may be achieved when the lengths of the traces are well designed.

Taking the exemplary layout shown in FIG. 2 as an example, the trace 21 (for example, the line segment extending from point A1 to point A2) has a corresponding length L_A, the trace 22 (for example, the line segment extending from point B1 to point B2) has a corresponding length L_B and the trace 23 (for example, the line segment extending from point C1 to point C2) has a corresponding length L_C. According to an embodiment of the invention, the lengths L_A, L_B and L_C may be substantially equal to an integer multiple of one quarter wavelength at a designate operating frequency, wherein the designate operating frequency may be the resonance frequency of the wanted signal in the wanted frequency band. Therefore, in the embodiments of the invention, the lengths L_A, L_B and L_C may be designed based on the designate operating frequency and the material of the substrate.

It should be noted that the points A1 and B1 may be the same point (for example, the connection node of the corresponding two traces or two resonators) or two different points with a short distance apart. Similarly, the points C1 and B2 may be the same point (for example, the connection node of the corresponding two traces or two resonators) or two different points with a short distance apart.

In a first scenario of the invention, the lengths L_A, L_B and L_C may be substantially equal to one quarter wavelength at the designate operating frequency (for example, L_A=L_B=L_C=λ/4). In the first scenario, at the point A shown in FIG. 1, for the unwanted signal, the open circuit stub of the first filtering element 110 will look like a short circuit and the open circuit stub of the second filtering element 120 will look like an open circuit. Therefore, the unwanted signal will not go through to port_2. The total network operates as a notch filter for the unwanted signal.

Figure 6:
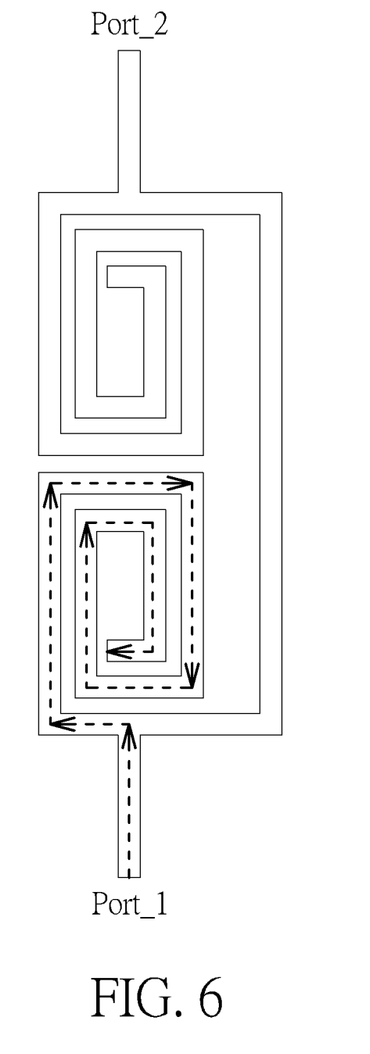
FIG. 6 is an exemplary diagram showing the signal conducting path provided by the first filtering element of the filter circuit for filtering the unwanted signal according to an embodiment of the invention.

FIG. 6 is an exemplary diagram showing the signal conducting path provided by the first filtering element of the filter circuit for filtering the unwanted signal according to an embodiment of the invention. As shown in FIG. 6, the unwanted signal (for example, 28 GHz signal) will not go through to the port_2.

Figure 7:
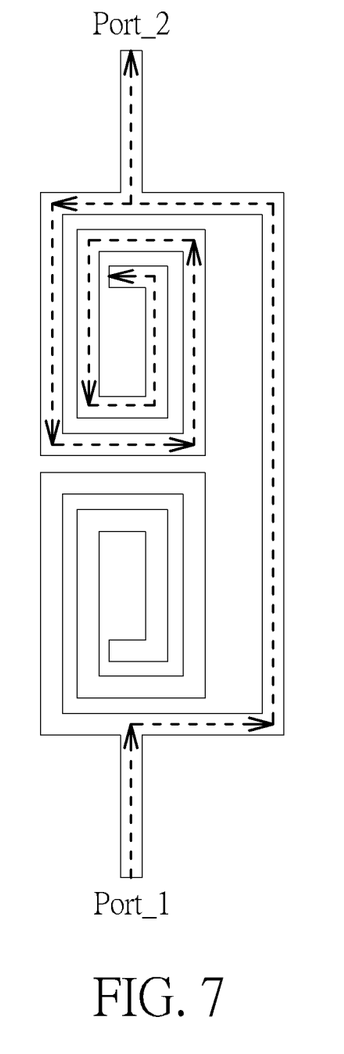
FIG. 7 is an exemplary diagram showing the signal conducting path provided by the second filtering element of the filter circuit for passing the wanted signal according to an embodiment of the invention.

FIG. 7 is an exemplary diagram showing the signal conducting path provided by the second filtering element of the filter circuit for passing the wanted signal according to an embodiment of the invention. As shown in FIG. 7, the wanted signal (for example, 39 GHz signal) will be passed to the port_2.

In a second scenario of the invention, the length L_A may be substantially equal to the length L_C, and the length L_B may be different from the lengths L_A and L_C. For example, the lengths L_A and L_C may be one quarter wavelength at the designate operating frequency, and the length L_B may be an integer multiple of one quarter wavelength at the designate operating frequency. In the embodiments of the invention, when the length L_A is equal to the length L_C, good rejection ability for rejecting the unwanted signal can be achieved.

In a third scenario of the invention, the lengths L_A, L_B and L_C may be different from each other, and L_A<L_B<L_C or L_A>L_B>L_C. In the case when the lengths L_A and L_C are different, the filter circuit may provide two notches and the rejection bandwidth (which may be defined by the two notches) may be adjusted by controlling the lengths L_A and L_C of the corresponding trances.

Figure 8:
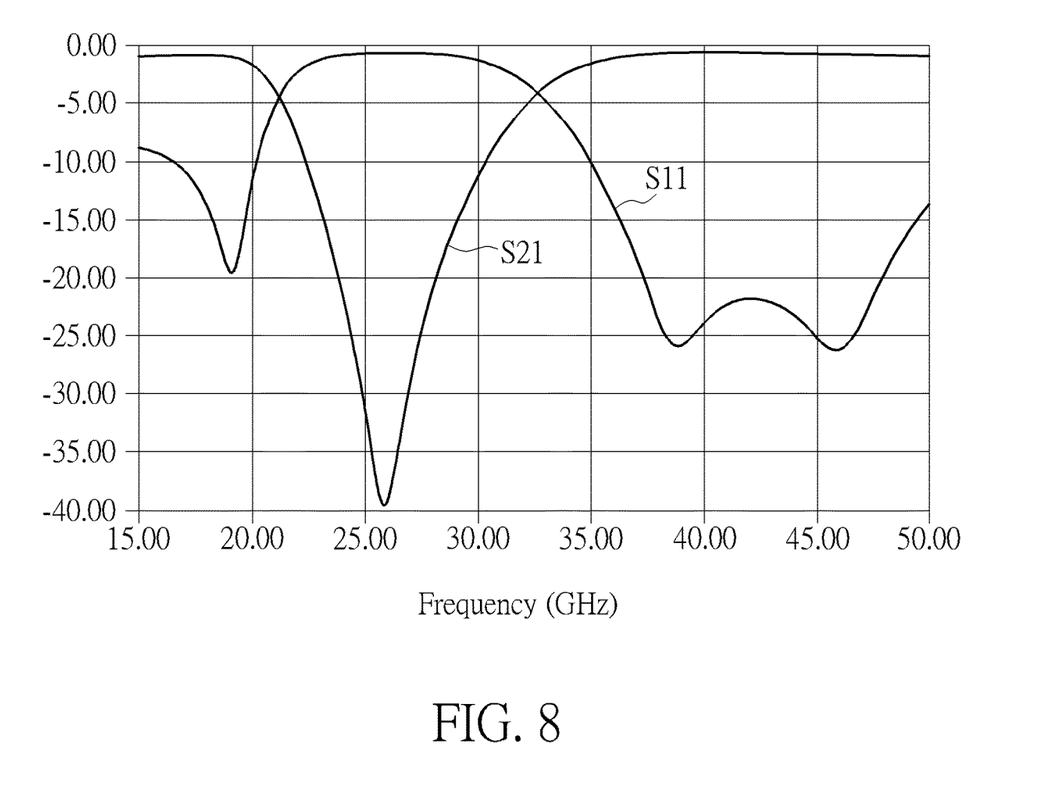
FIG. 8 is a diagram showing the return loss curve S11 and the insertion loss curve S21 according to an embodiment of the invention.

FIG. 8 is a diagram showing the return loss curve S11 and the insertion loss curve S21 according to an embodiment of the invention. In this embodiment, the filter circuit is designed as a 28 GHz band notch filter for filtering out 28 GHz signal and keep 39 GHz signal; In other embodiment, the filter circuit is designed as a 39 GHz band notch filter for filtering out 39 GHz signal and keep 28 GHz.

According to an embodiment of the invention, the proposed filter circuit as illustrated above may be utilized in a diplexer.

Figure 9:
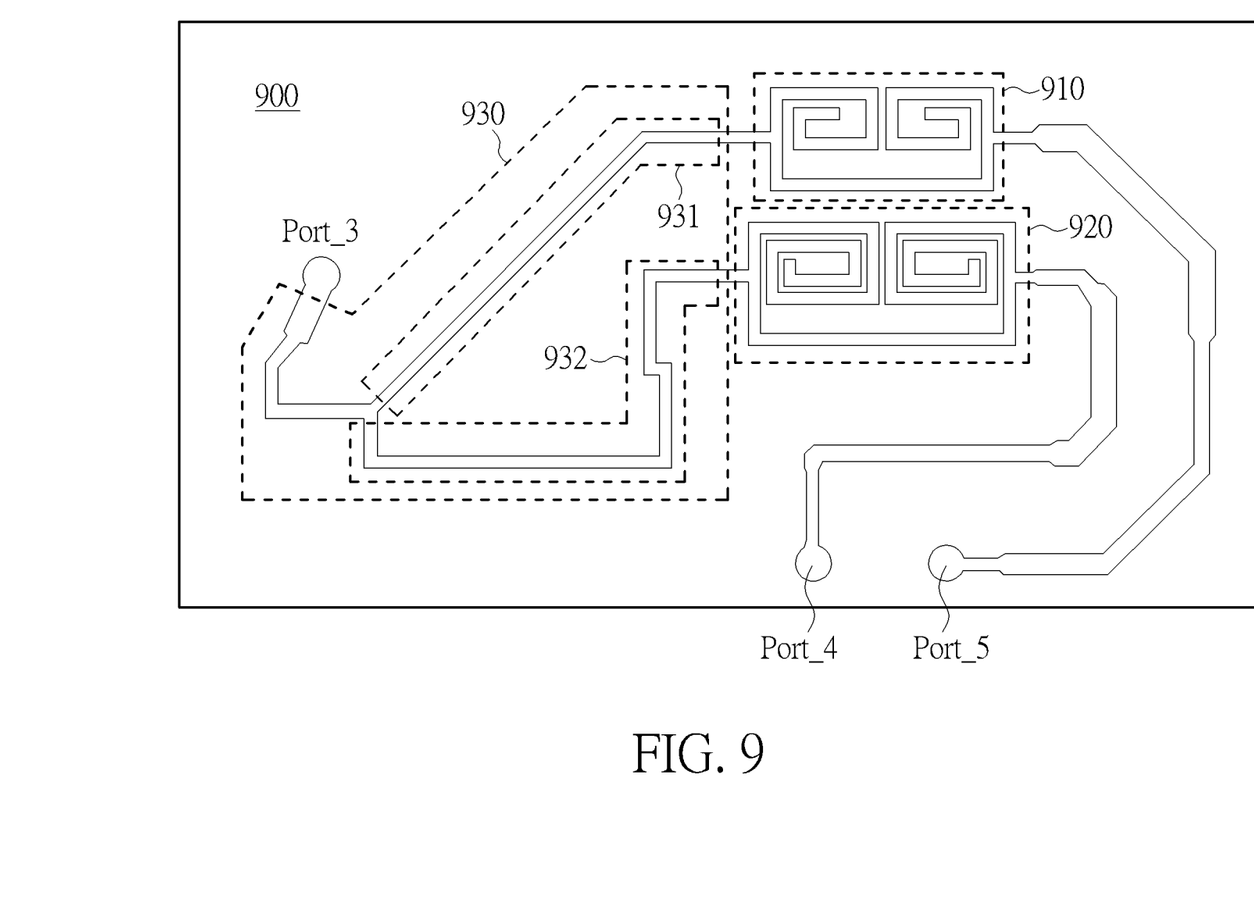
FIG. 9 shows an exemplary layout of a diplexer circuit according to an embodiment of the invention.

FIG. 9 shows an exemplary layout of a diplexer circuit according to an embodiment of the invention. The diplexer circuit may comprise two filter circuits 910 and 920 and a combiner 930, where the filter circuits 910 and 920 may be implemented by a plurality of traces routed on the substrate 900 as discussed above. Suppose that the diplexer circuit is configured to transmit a first signal having a first resonance frequency and a second signal having a second resonance frequency, the filter circuit 910 may be designed as a first notch filter for filtering out the unwanted signal (for example, the signal having the second resonance frequency) by controlling the lengths of the corresponding traces as illustrated above. Similarly, the filter circuit 920 may be designed as a second notch filter for filtering out the unwanted signal (for example, the signal having the first resonance frequency) by controlling the lengths of the corresponding traces as illustrated above.

The diplexer circuit may further comprise ports Port_3, Port_4 and Port_5. The ports Port_4 and Port_5 may be the input ports and the port Port_3 may be the output port, and vice versa.

According to an embodiment of the invention, the combiner 930 may also be implemented by a plurality of traces routed on the substrate 900, such as the trace 931 connected to the filter circuit 910, the trace 932 connected to the filter circuit 920 and the trace connected to the port Port_3. According to an embodiment of the invention, the lengths of the traces 931 and 932 may be designed according to the designate operating frequency of the corresponding filter circuit.

To be more specific, in an embodiment of the invention, suppose that the filter circuit 910 is a notch filter for filtering out 39 GHz signal, the length of the trace 931 connected to the filter circuit 910 may be designed as quarter wavelength at 39 GHz. Similarly, suppose that the filter circuit 920 a notch filter for filtering out 28 GHz signal, the length of the trace 932 connected to the filter circuit 920 may be designed as quarter wavelength at 28 GHz.

Therefore, in the embodiments in the first scenario of the invention, when the lengths L_A, L_B and L_C of the first, second and third traces of the filter circuit 910 are equal to one quarter wavelength at 28 GHz (that is, the designate operating frequency of filter circuit 910 when the filter circuit 910 is a notch filter for filtering out 39 GHz signal and passing 28 GHz signal), and when the lengths L_A, L_B and L_C of the first, second and third traces of the filter circuit 920 are equal to one quarter wavelength at 39 GHz (that is, the designate operating frequency of filter circuit 920 when the filter circuit 920 is a notch filter for filtering out 28 GHz signal and passing 39 GHz signal), a summation of the lengths of the trace 931 and the first/second/third trace of the filter circuit 910 may be the same as a summation of the lengths of the trace 932 the first/second/third trace of the filter circuit 920.

Figure 10:
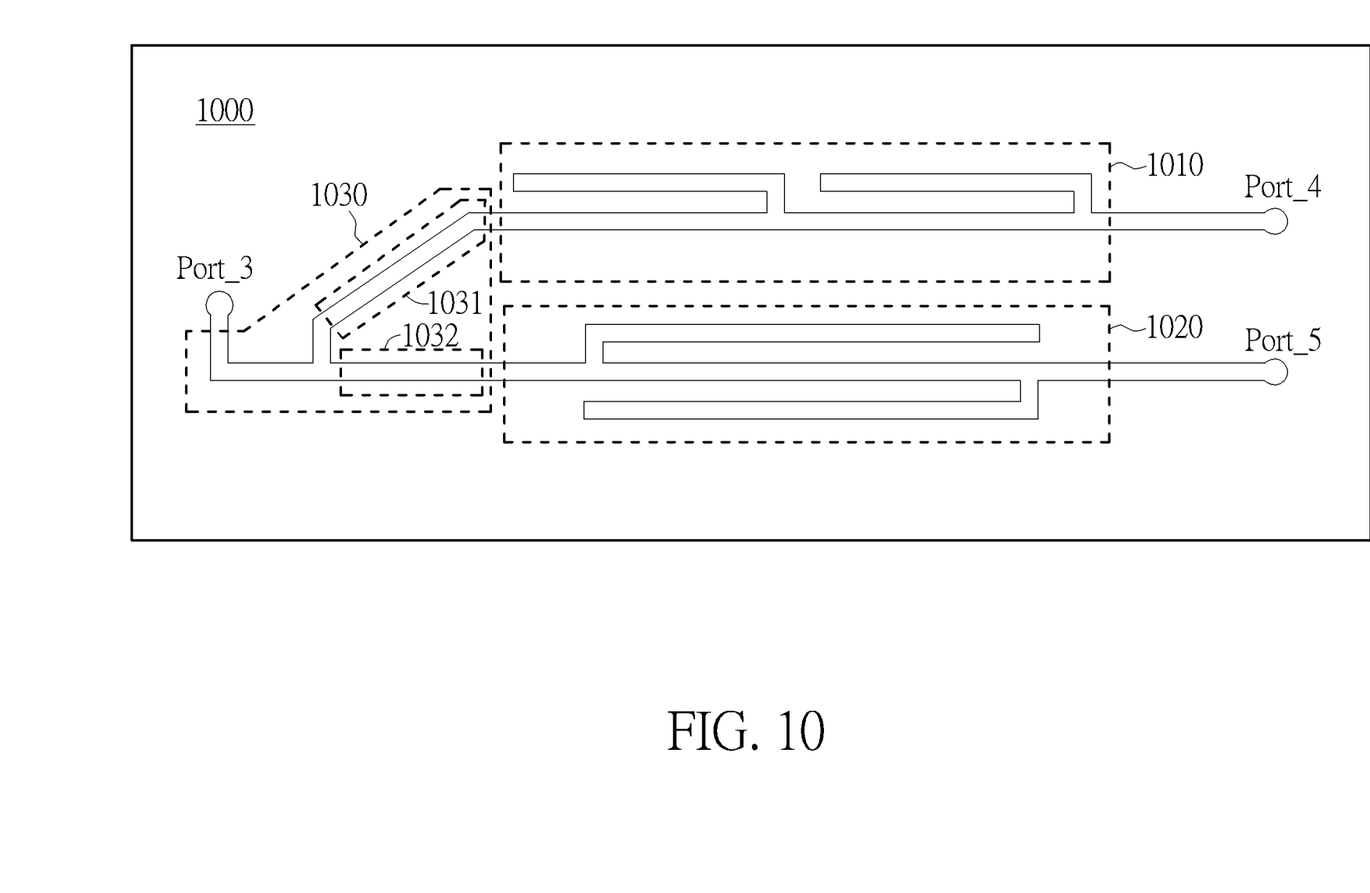
FIG. 10 shows an exemplary layout of a diplexer circuit according to another embodiment of the invention.

FIG. 10 shows an exemplary layout of a diplexer circuit according to another embodiment of the invention. The diplexer circuit may comprise two filter circuits 1010 and 1020 and a combiner 1030, where the filter circuits 1010 and 1020 may be implemented by a plurality of traces routed on the substrate 1000 as discussed above. Similarly, the combiner 1030 may also be implemented by a plurality of traces routed on the substrate 1000, such as the trace 1031 connected to the filter circuit 1010, the trace 1032 connected to the filter circuit 1020 and the trace connected to the port Port_3.

In this embodiment, the layouts of the filter circuits and the combiner have slender shapes. The lengths of the traces 1031 and 1031 may be designed according to the designate operating frequency of the corresponding filter circuit as discussed above. Similar trace length design concept discussed above may also be applied when the layouts of the circuits are in a slender shape. Therefore, for detailed illustrations of the trace length design, reference may be made to the illustrations of FIG. 9, and are omitted here for brevity.

It should be noted that FIG. 9 and FIG. 10 are illustrated by way of example and the drawings are not necessarily drawn to scale.

The proposed filter circuit is designed to be implemented by several adjustable resonators with adjusted resonating frequencies, and is capable of operating as a general notch filter which has a strong and deep notch (or, more than one notch) at a specific frequency and also achieving two of low pass and high pass filter responses. In this manner, good filtering performance can be achieved.

In addition, since the adjustable resonators may be implemented by traces (such as metal traces, transmission lines, or the likes), the overall size of the proposed filter circuit is very small and can be easily applied in millimeter wave applications. In addition, since the filter circuit may also be designed to have a slender shape, which is helpful for being packaged in a thin, flat and/or narrow shape package.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A filter circuit, comprising:
an input node;
an output node;
a first filtering element, having a first terminal coupled to the input node and a second terminal, and configured to provide a first signal conducting path toward the second terminal for conducting a first signal received at the input node to the second terminal; and
a second filtering element, having a first terminal coupled to the input node and a second terminal, and configured to provide a second signal conducting path toward the output node for conducting a second signal received at the input node to the output node,
wherein the second terminal of the first filtering element and the second terminal of the second filtering element are open-circuit terminals,
wherein the first filtering element comprises a first resonator, the second filtering element comprises a second resonator and a third resonator coupled in serial between the input node and the second terminal of the second filtering element, and a connection node of the second resonator and the third resonator is coupled to the output node,
wherein the first resonator is a first trace on a substrate, the second resonator is a second trace on the substrate, the third resonator is a third trace on the substrate, and
wherein the first trace, the second trace, and the third trace are on the same layer.

2. The filter circuit of claim 1, wherein the first trace and the third trace are routed spirally on the substrate.

3. The filter circuit of claim 1, wherein the first trace, second trace and the third trace are routed flat and straight toward at least a predetermined direction on the substrate.

4. The filter circuit of claim 1, wherein the first trace has a first length, the second trace has a second length and the third trace has a third length, and wherein the first length, the second length and the third length are substantially equal to an integer multiple of one quarter wavelength at a designate operating frequency.

5. The filter circuit of claim 4, wherein the designate operating frequency is a resonance frequency of the second signal.

6. The filter circuit of claim 1, wherein the first trace has a first length, the second trace has a second length and the third trace has a third length, the first length is substantially equal to the third length and the second length is different from the first length and the third length.

7. A filter circuit, comprising:
an input node;
an output node;
a first filtering element, having a first terminal coupled to the input node and a second terminal, and configured to filter out a signal with a first frequency signal for not going through to the output node;
a second filtering element, having a first terminal coupled to the input node and a second terminal, and configured to allow a signal with a second frequency to go through the output node,
wherein the second terminal of the first filtering element and the second terminal of the second filtering element are open-circuit terminals,
wherein the first filtering element comprises a first resonator, the second filtering element comprises a second resonator and a third resonator coupled in serial between the input node and the second terminal of the second filtering element, and a connection node of the second resonator and the third resonator is coupled to the output node,
wherein the first resonator is a first trace on a substrate, the second resonator is a second trace on the substrate, the third resonator is a third trace on the substrate, and
wherein the first trace, the second trace, and the third trace are on the same layer.

8. A filter circuit, comprising:
an input node;
an output node;
a first trace, routed on a substrate and having a first terminal coupled to the input node and a second terminal;
a second trace, routed on the substrate and having a first terminal coupled to the input node and a second terminal coupled to the output node; and
a third trace, routed on the substrate and having a first terminal coupled to the output node and a second terminal,
wherein the first trace operates as a first filtering element for filtering out a first signal received at the input node, and
wherein the second trace and the third trace operate as a second filtering element for passing a second signal received at the input node to the output node, and
wherein the first trace, the second trace, and the third trace are on the same layer.

9. The filter circuit of claim 8, wherein the first trace, the second trace and the third trace are routed flat and straight toward at least a predetermined direction on the substrate.

10. The filter circuit of claim 8, wherein the second terminal of the first trace and the second terminal of the third trace are open-circuit terminals.

11. The filter circuit of claim 8, wherein the first trace has a first length, the second trace has a second length and the third trace has a third length, and wherein the first length, the second length and the third length are substantially equal to an integer multiple of one quarter wavelength at a designate operating frequency.

12. The filter circuit of claim 11, wherein the designate operating frequency is a resonance frequency of the second signal.

13. The filter circuit of claim 8, wherein the first trace has a first length, the second trace has a second length and the third trace has a third length, the first length is substantially equal to the third length and the second length is different from the first length and the third length.

14. The filter circuit of claim 8, wherein the first trace and the third trace are routed spirally on the substrate.

15. The filter circuit of claim 14, wherein the first trace and the second trace are routed spirally as rectangular spirals on substrate.

16. The filter circuit of claim 14, wherein the first trace and the second trace are routed spirally as circular spirals on substrate.

* * * * *